United States Patent
Takeda

(10) Patent No.: US 7,293,876 B2
(45) Date of Patent: Nov. 13, 2007

(54) LIGHT SOURCE UNIT AND PROJECTOR

(75) Inventor: Takashi Takeda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 283 days.

(21) Appl. No.: 11/057,201

(22) Filed: Feb. 15, 2005

(65) Prior Publication Data

US 2005/0213310 A1   Sep. 29, 2005

(30) Foreign Application Priority Data

Mar. 24, 2004 (JP) ............... 2004-087614
Mar. 24, 2004 (JP) ............... 2004-087615

(51) Int. Cl.
*G03B 21/14* (2006.01)
*F21V 9/16* (2006.01)
*F21S 6/00* (2006.01)

(52) U.S. Cl. .................. 353/22; 362/84; 362/257
(58) Field of Classification Search ............... 353/20, 353/22; 362/55, 84, 257, 600, 19
See application file for complete search history.

(56) References Cited

U.S. PATENT DOCUMENTS

| | | | |
|---|---|---|---|
| 5,467,417 A | 11/1995 | Nakamura et al. | |
| 6,322,225 B1 * | 11/2001 | Koike | 362/620 |
| 6,354,709 B1 * | 3/2002 | Campbell et al. | 362/627 |
| 6,447,135 B1 * | 9/2002 | Wortman et al. | 362/623 |
| 6,507,379 B1 | 1/2003 | Yokoyama et al. | |
| RE38,305 E * | 11/2003 | Gunjima et al. | 349/9 |
| 6,671,014 B2 | 12/2003 | Yokoyama et al. | |
| 6,671,452 B2 * | 12/2003 | Winston et al. | 385/146 |
| 6,900,858 B2 | 5/2005 | Yokoyama et al. | |
| 7,192,147 B2 | 3/2007 | Sakata et al. | |
| 2003/0086066 A1 | 5/2003 | Kato | |
| 2007/0121310 A1 | 5/2007 | Sakata et al. | |

FOREIGN PATENT DOCUMENTS

| | | |
|---|---|---|
| EP | 0 838 715 A1 | 4/1998 |
| EP | 1 055 944 A1 | 11/2000 |
| EP | 1 363 460 A2 | 11/2003 |
| JP | A-11-160655 | 6/1999 |
| JP | A-2000-221499 | 8/2000 |
| JP | A-2001-056451 | 2/2001 |
| JP | A-2002-319708 | 10/2002 |
| JP | A-2003-098483 | 4/2003 |
| JP | A-2003-329978 | 11/2003 |
| JP | A-2003-330109 | 11/2003 |
| WO | WO 97/43686 | 11/1997 |
| WO | WO 98/19201 A1 | 5/1998 |
| WO | WO 01/27528 A1 | 4/2001 |

* cited by examiner

*Primary Examiner*—Rodney Fuller
(74) *Attorney, Agent, or Firm*—Oliff & Berridge, PLC

(57) ABSTRACT

It is an object of the present invention to provide a light source unit that can supply bright light efficiently. The light source unit includes a light emitting unit that emits light, a phase plate that polarizes the light from the light emitting unit to produce a first polarized light and a second polarized light that is polarized in a different direction with respect to the first polarized light, a reflecting-type polarizing plate that transmits the first polarized light and reflects the second polarized light; and a reflector that is provided near both the light emitting unit and the phase plate, and reflects back a third light, which is a portion of the first polarized light and that passes through the phase plate, to the phase plate.

4 Claims, 9 Drawing Sheets

FIG.6
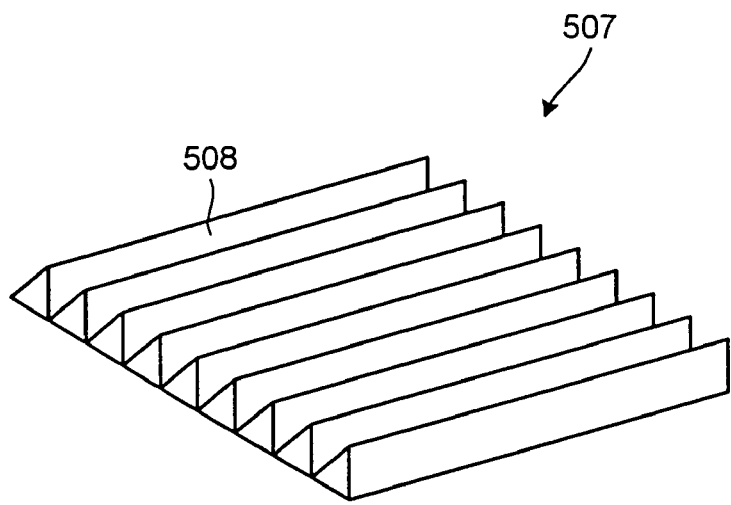
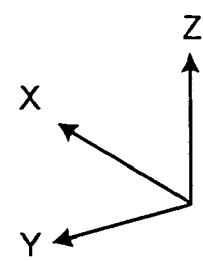
FIG.7
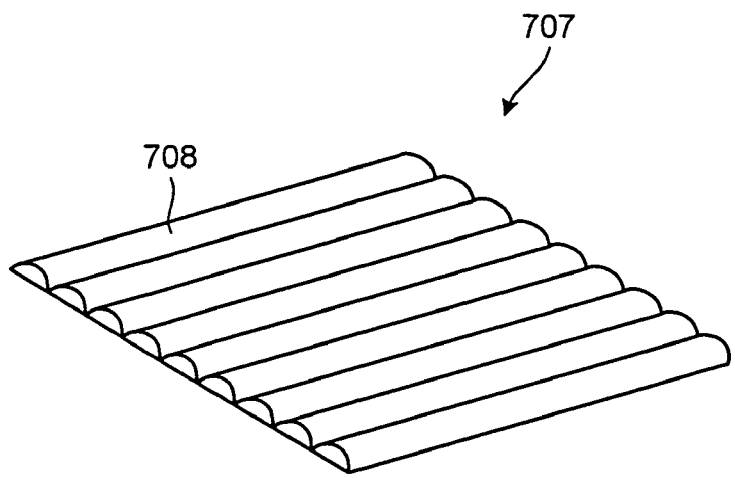
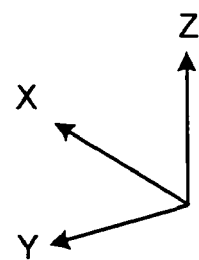

LIGHT SOURCE UNIT AND PROJECTOR

CROSS-REFERENCE TO RELATED APPLICATIONS

The present document incorporates by reference the entire contents of Japanese priority document, 2004-87164 filed in Japan on Mar. 24, 2004 and Japanese priority document, 2004-87615 filed in Japan on Mar. 24, 2004.

BACKGROUND OF THE INVENTION

1) Field of the Invention

The present invention relates to a light source unit and a projector, and more specifically, relates to a light source unit that uses a light emitting diode (hereinafter, "LED").

2) Description of the Related Art

Conventionally, several technologies have been proposed for a light source unit used for a liquid-crystal-type spatial-light-modulator in a projector. Japanese Patent Application Laid-Open Nos. 2003-98483 and 2000-221499 disclose technologies that the reflecting-type polarizing plate and the phase plate are used together for polarization conversion.

Japanese Patent Application Laid-Open No. 2003-98483 discloses a lighting system. In the lighting system, the reflecting-type polarizing plate and the phase plate are provided on an emission plane of a rod integrator. The light is reflected by the reflecting-type polarizing plate, then is reflected by a reflecting surface, which is arranged inside the rod integrator and on the incident side of the rod integrator, and travels toward the reflecting-type polarizing plate again. It is preferable in this lighting system to increase the area of the reflecting surface provided in the rod integrator as much as possible so that the light travels efficiently toward the reflecting-type polarizing plate. However, the amount of light that enters into the rod integrator from a light source decreases when the area of the reflecting surface increases. On the contrary, one approach to increase the amount of the light that enters into the rod integrator from the light source is to make the opening of the rod integrator large. However, in this case, the area of the reflecting surface decreases and hence less light travels toward the reflecting-type polarizing plate.

Japanese Patent Application Laid-Open No. 2000-221499 discloses a light source for image display. This light source includes a reflecting-type polarizing plate and a phase plate right behind a light emitting unit. The phase plate and the reflecting-type polarizing plate are laminated on the light emitting unit. An advantage of this technology is that diffusion of light from the light emitting unit is prevented and loss of light decreases as the reflecting-type polarizing plate and the phase plate are provided in a position closer to the light emitting unit. Therefore, this configuration enables high light usability. However, when the phase plate is formed of an organic compound, the phase plate is sometimes damaged due to the heat from the light emitting unit. If the phase plate is damaged, it becomes difficult to perform normal polarization conversion. Particularly, when electric current is injected up to the rated limit to obtain the amount of light as much as possible from a small light emitting unit, the temperature of the light emitting unit may rise to a high temperature. Therefore, polarization conversion may fail even if the reflecting-type polarizing plate and the phase plate are provided adjacent to the light emitting unit.

Further, Japanese Patent Application Laid-Open No. 2002-319708 discloses a technology for supplying bright light. Some LEDs have a substrate in the light emitting unit, and the light is supplied via the substrate. For example, an LED that has the flip-chip-mounted light-emitting unit generates light in a semiconductor layer below a sapphire substrate. The light comes from the semiconductor layer, passes through the sapphire substrate directly or passes through the sapphire substrate after being reflected by an electrode layer, and is outputted. When the light enters into an interface between the air and the sapphire substrate at an angle equal to or larger than a critical angle, the light is totally reflected on the interface and taken into the light emitting unit. Thus, the light taken into the light emitting unit is partially absorbed while repeating the total reflection and reflection on the electrode layer. This technology is proposed to overcome the above problem. In this technology, the light taken into the light emitting unit is decreased for supplying the bright light.

Japanese Patent Application Laid-Open No. 2002-319708 discloses a technology for improving the efficiency of the light source unit. In this technology, protrusions and recessions of about 1 micrometer are formed on a surface on the emission side of the sapphire substrate. The total reflection on the interface between the sapphire layer and the air is reduced by profiling the sapphire substrate, and thereby the efficiency of the light source unit improves. However, a disadvantage of this technology is that profiling is difficult since the sapphire substrate is very hard, and it is not easy to perform chemical processing such as oxidation. Therefore, another technology is still required to easily decrease the light taken into the light emitting unit without performing processing of the sapphire substrate.

In another technology, the total light reflection on the interface of the sapphire substrate is reduced by bonding another transparent member on the sapphire substrate. In general, the sapphire substrate and another transparent member are bonded by using an adhesive. However, when the sapphire substrate and another transparent member are bonded together, and the sapphire substrate and another transparent member thermally expand independently due to the heat from the light emitting unit, a distortion occurs in the bonded portion. The light emitting unit may be damaged due to the distortion. Particularly, the output of the LED is getting larger these days, and it is thereby conceivable that deterioration in such a bonded portion becomes notable. Therefore, still another technology is required for reducing the total light reflection on the interface of the sapphire substrate.

As explained above, it is difficult in the conventional technologies to supply light efficiently.

SUMMARY OF THE INVENTION

It is an object of the present invention to solve at least the above conventional problems.

According to one aspect of the present invention, a light source unit includes a light emitting unit that emits light; a phase plate that polarizes the light from the light emitting unit to produce a first polarized light and a second polarized light that is polarized in a different direction with respect to the first polarized light; a reflecting-type polarizing plate that transmits the first polarized light and reflects the second polarized light; and a reflector that is provided near both the light emitting unit and the phase plate, and reflects back a third light to the phase plate. The third light is a portion of the first polarized light and that passes through the phase plate.

After the light is reflected by reflecting-type polarizing plate and passes through the phase plate, the light enters into the light emitting unit and the reflector. An electrode of the light emitting unit may be formed of a highly reflective member. When the electrode of the light emitting unit is formed of a highly reflective member, the light is reflected by the electrode of the light emitting unit after the light passes through the phase plate and enters into the light emitting unit. When the light passes through the phase plate, and is reflected by the electrode of the light emitting unit and the reflector, some light partially enters into the phase plate directly, and some light enters into the phase plate after being reflected by the electrode of the light emitting unit or the reflector again.

The reflector is arranged near the light emitting unit and close to the phase plate. By arranging the reflector at such a position, the light reflected by the reflecting-type polarizing plate and transmitted through the $\lambda/4$ phase plate is confined in a space surrounded by the light emitting unit, the reflector, and the phase plate. After the light enters into the space surrounded by the light emitting unit, the reflector, and the phase plate, the light passes through the phase plate and enters into the reflecting-type polarizing plate while the light is repeatedly reflected by the light emitting unit and the reflector. Thus, by arranging the reflector, it is prevented that the light that is reflected by the reflecting-type polarizing plate and returns to the direction of the light emitting unit diffuses to the outside of the light source unit, and loss of light is reduced. Accordingly, the light source unit supplies bright light efficiently.

According to another aspect of the present invention, the light source unit further includes a structure that is formed of an optically transparent member and arranged between the light emitting unit and the phase plate.

By arranging a structure formed of an optically transparent member, deterioration of the phase plate due to heat is reduced, and normal polarization conversion is performed for long time. Since the influence of heat on the phase plate is reduced, the phase plate may be formed of an organic compound that has a relatively low heat resistance. Preferably, the structure arranged between the light emitting unit and the phase plate is formed of a transparent member that has a low thermal conductivity. Deterioration of the phase plate due to heat is further reduced by forming the structure of a transparent member that has a low thermal conductivity.

According to still another aspect of the present invention, in the light source unit, the structure is a rod integrator that substantially uniformalizes light amount distribution of the light from the light emitting unit.

By arranging the rod integrator as a structure formed of a transparent member, the light amount distribution of the light from the light emitting unit is substantially uniformalized, as well as the polarization conversion. Moreover, when the rod integrator is arranged close to the light emitting unit, even if the rod integrator has a short length in the optical axis direction, the rod integrator substantially uniformalizes the light amount distribution of light sufficiently. Accordingly, the light amount distribution of light from the light emitting unit is substantially uniformalized with a small configuration.

According to still another aspect of the present invention, in the light source unit, the light emitting unit, the phase plate, and the reflecting type polarizing plate are sequentially laminated, and the light source unit further includes an optical element that outputs the first polarized light and is provided on a surface of the reflecting-type polarizing plate, the surface being on a different side from a side where the phase plate is arranged.

The phase plate may be formed of a member of an inorganic compound such as crystal, and mica plate. The phase plate formed of the above described inorganic compound member has relatively excellent heat resistance. Therefore, the phase plate formed of the above described inorganic compound member can be laminated on the light emitting unit.

When the light emitting unit, the phase plate, and the reflecting-type polarizing plate are laminated, the light from the light emitting unit passes through the reflecting-type polarizing plate without going through the air. In such a case, the light may be totally reflected on the emission-side interface of the reflecting-type polarizing plate. If the light is totally reflected by the reflecting-type polarizing plate, the amount of light from the light source unit decreases. Therefore, by arranging an optical element on the emission plane of the reflecting-type polarizing plate, emission of the light that passes through the reflecting-type polarizing plate is accelerated, and the light is outputted from the light source unit more efficiently. Accordingly, the light source unit has high light usability.

According to still another aspect of the present invention, a projector includes a light source unit that includes a light emitting unit that emits light; a phase plate that polarizes the light from the light emitting unit to produce a first polarized light and a second polarized light that is polarized in a different direction with respect to the first polarized light; a reflecting-type polarizing plate that transmits the first polarized light and reflects the second polarized light; and a reflector that is provided near both the light emitting unit and the phase plate, and reflects back a third light to the phase plate, wherein the third light is a portion of the first polarized light and that passes through the phase plate; a spatial light modulator that modulates the light from the light source unit according to an image signal; and a projection lens that projects the light modulated by the spatial light modulator.

By using the above projector, bright light is supplied with high light usability. Therefore, the projector projects a bright image.

According to still another aspect of the present invention, a light source unit includes a light emitting unit that includes a substrate and supplies light via the substrate; and a light propagating unit that propagates evanescent light from the substrate in the light source unit, the propagating unit being formed of a transparent member, and provided at a position where the evanescent light reaches.

When the light enters into the emission-side interface between the substrate of the light emitting unit and the air at an angle equal to or larger than the critical angle, the light is taken into the light emitting unit since the light is totally reflected on the interface between the substrate and the air. When the light is totally reflected on the interface of the substrate, evanescent light leaks from the surface of the substrate in a thickness equal to or smaller than the wavelength of the light. By arranging the light propagating unit at a position where the evanescent light reaches, the evanescent light is propagated through the light propagating unit. Moreover, since the evanescent light is propagated through the light propagating unit, the evanescent light is taken out to the emission side without returning into the substrate again. Thus, the light source unit takes out the light from the light emitting unit to the outside.

Some light emitting units of LEDs supply light via the sapphire substrate. Since the sapphire substrate is very hard and it is not easy to perform chemical processing such as oxidation, profiling of the sapphire substrate is difficult. On the other hand, in the present invention, it is not necessary to perform processing of the substrate of the light emitting unit, and the light taken into the light emitting unit is easily reduced. Since the light propagating unit needs only to be provided near the substrate and at a position where the evanescent light reaches, it is not necessary to bond the light propagating unit and the substrate. Therefore, a distortion between the light propagating unit and the substrate is reduced, and a configuration becomes hardly damaged. Particularly, in a high-output LED, deterioration in the light emitting unit is reduced. Accordingly, the light source unit decreases the light taken into, and supplies bright light efficiently.

According to still another aspect of the present invention, in the light source unit, the light propagating unit has an incident plane on a side where the light from the light emitting unit enters, and has a plurality of fine protrusions on the incident plane.

By arranging the protrusions on the incident plane of the light propagating unit, the evanescent light behaves as if the refractive index increases when the light travels deep into the fine structure. When the evanescent light behaves as if the refractive index increases in the fine structure, the evanescent light changes the direction gradually toward the emission side of the light propagating unit. Thus, the light propagating unit propagates the evanescent light to the emission side. Therefore, the light is outputted efficiently.

According to still another aspect of the present invention, in the light source unit, the light propagating unit has an emission plane on a side where the light from the light emitting unit is outputted, and an optical element, on the emission plane, for outputting the light transmitted through the light propagating unit.

Since the light propagating unit is formed of a transparent member, the light may be totally reflected on the emission-side interface. If the light is totally reflected by the light propagating unit, the amount of light from the light source unit decreases. Therefore, by arranging an optical element on the emission plane of the light propagating unit, emission of the light that passes through the light propagating unit is accelerated, and the light is outputted from the light source unit more efficiently. Accordingly, the light source unit has high light usability.

According to still another aspect of the present invention, in the light source unit, the light propagating unit is a rod integrator that substantially uniformalizes light amount distribution of the light from the light emitting unit, and the light propagating unit has an incident plane on a side where the light from the light emitting unit enters, an emission plane on a side where the light from the light emitting unit is outputted, a plurality of fine protrusions on the incident plane, and an optical element, on the emission plane, for outputting the light propagated through the light propagating unit.

By arranging the rod integrator a transparent member, the light amount distribution of the light from the light emitting unit is substantially uniformalized, as well as the polarization conversion. By arranging the protrusions on the incident plane of the rod integrator, emission of the light that passes through the light propagating unit is accelerated. Accordingly, the light source unit has high light usability, and substantially uniformalizes the light amount distribution of light from the light emitting unit.

According to still another aspect of the present invention, a projector includes a light source unit that includes a light emitting unit that includes a substrate and supplies light via the substrate; and a light propagating unit that propagates evanescent light from the substrate in the light source unit, the propagating unit being formed of a transparent member, and provided at a position where the evanescent light reaches; a spatial light modulator that modulates the light from the light source unit according to an image signal; and a projection lens that projects the light modulated by the spatial light modulator.

By using the above projector, bright light is supplied with high light usability. Therefore, the projector projects a bright image.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 6 is a perspective view of an optical element;

FIG. 7 is a perspective view of another optical element;

DETAILED DESCRIPTION

Exemplary embodiments of a light source unit and a projector according to the present invention will be explained below in detail with reference to the accompanying drawings.

Figure 1:
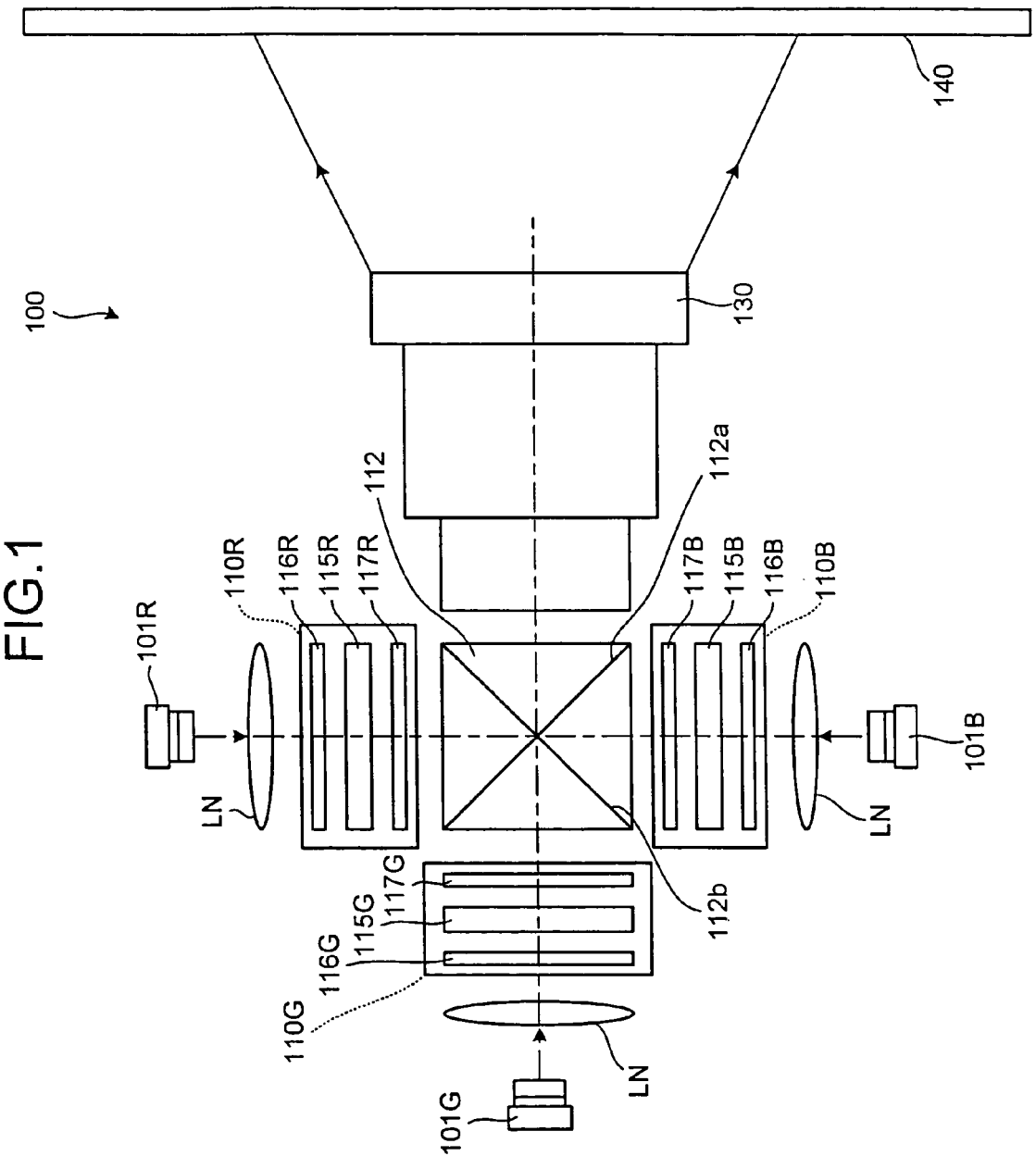
FIG. 1 is a schematic block diagram of a projector according to a first embodiment of the present invention.

FIG. 1 is a schematic block diagram of a projector 100 according to a first embodiment of the present invention. The projector 100 includes an R-light source unit 101R that supplies R light, which is a first color light, a G-light source unit 101G that supplies G light, which is a second color light, and a B-light source unit 101B that supplies B light, which a third color light.

The R-light source unit 101R supplies polarized light in a specific vibration direction, for example, p-polarized R-light. The R light comes from the R-light source unit 101R, passes through a lens LN, and enters into an R-light spatial light modulator 110R. The R-light spatial light modulator 110R is a transmission-type liquid-crystal-display unit that modulates R light according to the image signal. The R-light spatial light modulator 110R includes a liquid crystal panel 115R, a first polarizing plate 116R, and a second polarizing plate 117R.

The first polarizing plate 116R transmits the p-polarized R-light to the liquid crystal panel 115R. The liquid crystal panel 115R modulates the p-polarized light according to the image signal, and converts the p-polarized light into s-polarized light. The second polarizing plate 117R outputs the s-polarized R-light, which is converted by the liquid crystal panel 115R. Thus, the R-light spatial light modulator 110R modulates the R light from the R-light source unit 101R according to the image signal. Then, the s-polarized R-light enters into a cross dichroic prism 112.

The G-light source unit 101G supplies polarized light in a specific vibration direction, for example, s-polarized G-light. The G light comes from the G-light source unit 101G, passes through a lens LN, and enters into a G-light spatial light modulator 110G. The G-light spatial light modulator 110G is a transmission-type liquid-crystal-display unit that modulates G light according to the image signal. The G-light spatial light modulator 110G includes a liquid crystal panel 115G, a first polarizing plate 116G, and a second polarizing plate 117G.

The first polarizing plate 116G transmits the s-polarized G-light to the liquid crystal panel 115G. The liquid crystal panel 115G modulates the s-polarized light according to the image signal, and converts the s-polarized light into p-polarized light. The second polarizing plate 117G outputs the p-polarized G-light, which is converted by the liquid crystal panel 115G. Thus, the G-light spatial light modulator 110G modulates the G light from the G-light source unit 101G according to the image signal. Then, the p-polarized G-light enters into a cross dichroic prism 112 from a surface different from that for the R light.

The B-light source unit 101B supplies polarized light in a specific vibration direction, for example, p-polarized B-light. The B light comes from the B-light source unit 101B, passes through a lens LN, and enters into a B-light spatial light modulator 110B. The B-light spatial light modulator 110B is a transmission-type liquid-crystal-display unit that modulates B light according to the image signal. The B-light spatial light modulator 110B includes a liquid crystal panel 115B, a first polarizing plate 116B, and a second polarizing plate 117B.

The first polarizing plate 116B transmits the p-polarized B-light to the liquid crystal panel 115B. The liquid crystal panel 115B modulates the p-polarized light according to the image signal, and converts the p-polarized light into s-polarized light. The second polarizing plate 117B outputs the s-polarized B-light, which is converted by the liquid crystal panel 115B. Thus, the B-light spatial light modulator 110B modulates the B light from the B-light source unit 101B according to the image signal. Then, the s-polarized B-light enters into a cross dichroic prism 112 from a surface different from those for the R light and the G light.

The cross dichroic prism 112, corresponding to a color-combining optical system, has two dichroic films 112a and 112b. The dichroic films 112a and 112b are arranged orthogonal to each other in an X shape. The dichroic film 112a reflects the s-polarized R-light, and transmits the p-polarized G-light. The dichroic film 112b reflects the s-polarized B-light, and transmits the p-polarized G-light. Thus, the dichroic films 112a and 112b combine the R light, the G light, and the B light, respectively modulated by the R-light spatial light modulator 110R, the G-light spatial light modulator 110G, and the B-light spatial light modulator 110B. A projection lens 130 projects the light combined by the cross dichroic prism 112 onto a screen 140.

The dichroic films 112a and 112b normally have excellent reflection characteristics of the s-polarized light. Therefore, the R light and the B light to be reflected respectively by the dichroic films 112a and 112b are set so that the R light and the B light are s-polarized when the R light and B-light enter into the cross dichroic prism 112. The G light to pass through the dichroic films 112a and 112b is set so that the G light is p-polarized when the G light enters into the cross dichroic prism 112.

Figure 2:
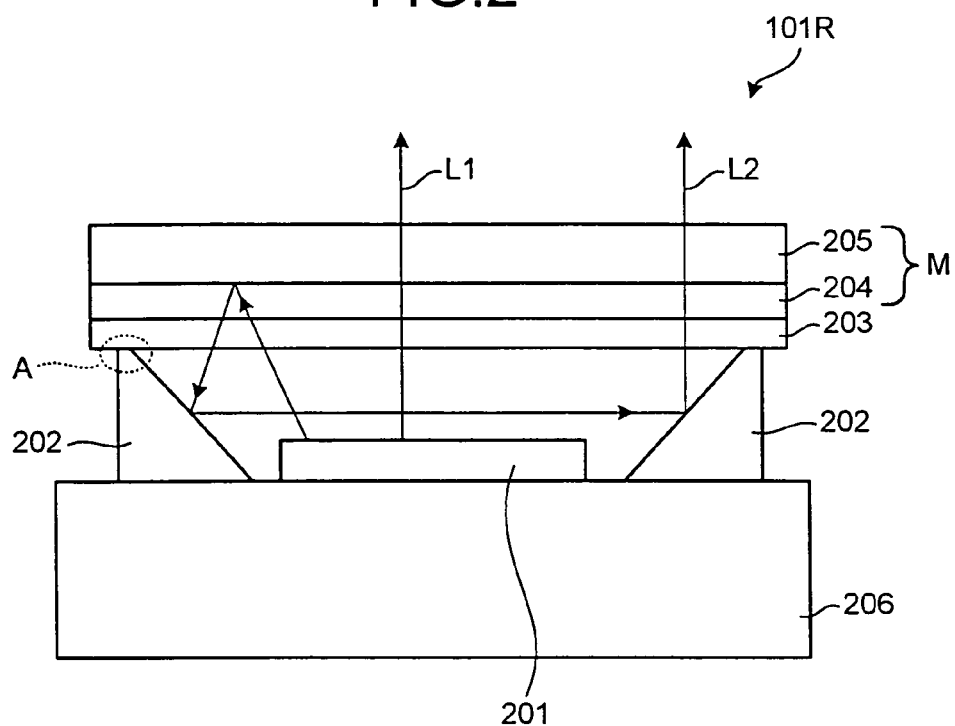
FIG. 2 is a cross-sectional view of a light source unit according to the first embodiment.

The light source units 101R, 101G, and 101B will be explained below. Since the light source units 101R, 101G, and 101B have the same configuration in the present invention, the R-light source unit will be explained as an example in this embodiment and other embodiments. FIG. 2 is a cross-sectional view of the R-light source unit 110R. In the R-light source unit 101R, a light emitting unit 201 is mounted on a substrate 206. The light emitting unit 201 is a light-emitting chip of an LED, which is a solid light emitting diode. The light emitting unit 201 supplies the R light.

A reflector 202 is provided on a substrate 206, near the light emitting unit 201. The R light is reflected by the reflector 202 after the R light is reflected by a reflecting-type polarizing plate 205 and transmitted through a λ/4 phase plate 204. The reflector 202 has an inclined plane on the light emitting unit 201 side, and has a tapered shape that has a wider expanse toward the emission side of the R-light source unit 101R. The reflector 202 may be formed of a highly reflective member, for example, a metal member, such as aluminum or silver. In FIG. 2, the reflector 202 is indicated as two right-angled triangles on the right and left sides of the light emitting unit 201. The oblique sides of the two right-angled triangles face the light emitting unit 201 and correspond to the tapered surface of the reflector 202. When seen from the emission side of the R-light source unit 101R, the reflector 202 has a rectangular annular shape surrounding the rectangular light emitting unit 201.

A transparent plate 203 is provided on the emission side of the light emitting unit 201 and the reflector 202. The transparent plate 203 is a structure formed of an optically transparent member. The transparent plate 203 is provided between the light emitting unit 201 and the λ/4 phase plate 204. The transparent plate 203 is joined to the edge of the reflector 202 at a position A. The reflector 202 and the transparent plate 203 are joined at the position A, which is closer to the emission side than the position where the light emitting unit 201 is provided. Therefore, a gap is provided between the light emitting unit 201 and the transparent plate 203. The transparent plate 203 may be formed of, for example, a glass member that has low thermal conductivity. For example, optical glass PBH 71 or SF 58 can be used as the glass member that has low thermal conductivity. Another glass member or a resin member may be used as a transparent member so as to form the transparent plate 203, so long as the heat from the light emitting unit 201 is sufficiently insulated.

The λ/4 phase plate 204 and the reflecting-type polarizing plate 205 are sequentially laminated on the emission side of the transparent plate 203. The λ/4 phase plate 204 converts the polarized state of the R light from the light emitting unit 201. The λ/4 phase plate 204 may be formed of an organic compound. The λ/4 phase plate 204 formed of an organic compound is relatively cheap. Therefore, the R-light source unit 101R can be formed at a low cost by using the λ/4 phase plate 204 formed of the organic compound.

The reflecting-type polarizing plate 205 transmits the polarized light in a specific vibration direction, for example, the p-polarized R-light from the λ/4 phase plate 204, and reflects the polarized light in other vibration directions different from the specific vibration direction. The reflecting-type polarizing plate 205 may be formed of a wire grid-type polarizer, which includes a lattice-shaped wire formed of a metal, such as aluminum, on a substrate formed of an optically transparent glass member. The wire grid-type polarizer transmits the polarized light whose vibration direction is substantially vertical to the wire, and reflects the polarized light whose vibration direction is substantially parallel to the wire. Since the wire grid-type polarizer is provided so that the wire becomes substantially vertical to the vibration direction of the polarized light in the specific vibration direction, only the polarized light in the specific vibration direction is transmitted.

Moreover, a cover glass protects the wire grid polarizer so as to reduce deterioration of the wire due to rust. For example, an inert gas is filled between the substrate and the cover glass. The wire may be sealed by a transparent resin member. The reflecting-type polarizing plate 205 may be formed of a corrugated polarizing film instead of the wire grid-type polarizer. After linear protrusions are formed substantially at equal intervals by a sputter, a film-like member is allowed to self grow thereon so as to form the polarizing film. The formed polarizing film can be directly stuck on the λ/4 phase plate 204.

The behavior of light from the light emitting unit 201 will be explained. The light supplied from the light emitting unit 201 enters into the transparent plate 203. The light from the light emitting unit 201 also enters into the transparent plate 203 after being reflected by the reflector 202 and electrodes in the light emitting unit 201. After the light passes through the transparent plate 203, the polarized state of the light is converted by the λ/4 phase plate 204. Then, the light enters into the reflecting-type polarizing plate 205 from the λ/4 phase plate 204. The light includes the p-polarized light L1 that is polarized in the specific vibration direction, and the p-polarized light L1 passes through the reflecting-type polarizing plate 205 and is outputted from the R-light source unit 101R.

The light from the light emitting unit 201 includes the polarized light in the vibration directions other than the specific vibration direction. This polarized light is reflected by the reflecting-type polarizing plate 205. After the light is reflected by the reflecting-type polarizing plate 205, the light passes through the λ/4 phase plate 204 and the transparent plate 203, and returns in the direction toward the light emitting unit 201. At this time, in the light reflected by the reflecting-type polarizing plate 205, for example, the s-polarized light is converted from linearly polarized light to circularly polarized light by the λ/4 phase plate 204. After the light passes through the λ/4 phase plate 204 and the transparent plate 203, the light enters into the reflector 202. Then, the light is reflected by the tapered surface of the reflector 202, enters into a position opposite to the incident position of the reflector 202, and travels in the direction toward the transparent plate 203.

The light enters into the transparent plate 203, and passes through the λ/4 phase plate 204 again. At this time, if the light is converted from the s-polarized light to the circularly polarized light, the light is now converted to the p-polarized light by the λ/4 phase plate 204. Then, the light L2, which is p-polarized, enters into the reflecting-type polarizing plate 205, passes through the reflecting-type polarizing plate 205, and is outputted from the R-light source unit 101R. On the other hand, if the polarized light is converted to the polarized light in other vibration directions different from the specific vibration direction by the λ/4 phase plate 204, the polarized light is reflected again by the reflecting-type polarizing plate 205, and the above circulation is repeated.

When the λ/4 phase plate 204 is provided on the light emitting unit 201 side of the reflecting-type polarizing plate 205, the linearly polarized light reflected by the reflecting-type polarizing plate 205 passes through the λ/4 phase plate 204 twice, until entering into the reflecting-type polarizing plate 205 again. The phase of the light changes by λ/2 since the light passes through the λ/4 phase plate 204 twice. Therefore, the linearly polarized light reflected by the reflecting-type polarizing plate 205 is partially converted to the linearly polarized light in the specific vibration direction until the light enters into the reflecting-type polarizing plate 205 again. Since the linearly polarized light enters into the reflecting-type polarizing plate 205 after the vibration direction of the circulated light changes, the polarized light in the specific vibration direction is sequentially taken out by the reflecting-type polarizing plate 205.

After the light is reflected by the reflecting-type polarizing plate 205 and transmitted through the λ/4 phase plate 204 and the transparent plate 203, the light may enter into the transparent plate 203 after being reflected by the reflector 202 twice, like the light L2, or the light may take other routes. For example, after the light passes through the λ/4 phase plate 204 and the transparent plate 203, the light is reflected by the electrodes in the light emitting unit 201, and travels in the direction toward the transparent plate 203. The light may be reflected by the electrodes in the light emitting unit 201 after the light is reflected by the reflector 202 toward the light emitting unit 201. Thus, the light reflected by the reflecting-type polarizing plate 205 travels in the space surrounded by the reflector 202, the light emitting unit 201, and the transparent plate 203 in various ways.

The reflector 202 is joined with the transparent plate 203 at the position A. The λ/4 phase plate 204 is laminated on the transparent plate 203. Therefore, when the reflector 202 is joined with the transparent plate 203, the light reflected by the reflecting-type polarizing plate 205 and transmitted through the λ/4 phase plate 204 is confined in the space surrounded by the light emitting unit 201, the reflector 202, and the λ/4 phase plate 204. After the light enters into the space surrounded by the light emitting unit 201, the reflector 202, and the λ/4 phase plate 204, the light passes through the λ/4 phase plate 204 and enters into the reflecting-type polarizing plate 205 while repeating reflection by the light emitting unit 201 and the reflector 202. Thus, since the reflector 202 is joined with the transparent plate 203, the reflector 202 confines the light that returns from the reflecting-type polarizing plate 205, and guides the light to the λ/4 phase plate 204.

By providing the reflector 202 in this manner, it is prevented that the light that is reflected by the reflecting-type polarizing plate 205 and returns to the direction of the light emitting unit 201 diffuses to the outside of the R-light source unit 101R, and loss of light is reduced. Further, by providing the λ/4 phase plate 204 and the reflecting-type polarizing plate 205 near the light emitting unit 201, the diffusion of the light reflected by the reflecting-type polarizing plate 205 is prevented, loss of light is reduced. Furthermore, the inclined plane provided on the reflector 202 reflects the light that travels at a large angle with respect to the optical axis, and allows the light to travel toward the reflecting-type polarizing plate 205 at a small angle with respect to the optical axis. When the light enters into the reflector 202 at a small angle with respect to the optical axis, the light is reflected by the reflector 202 twice and travels toward the reflecting-type polarizing plate 205 at a small angle with respect to the optical axis.

Although the transparent plate 203 is joined with the edge of the reflector 202 at the position A, the reflector 202 and the transparent plate 203 may not be joined together. It is only necessary that the reflector 202 and the transparent plate 203 are placed adjacent to each other. If the edge of the reflector 202 and the λ/4 phase plate 204 are placed adjacent to each other, diffusion of light that returns to the direction of the light emitting unit 201 is prevented and loss of light is reduced. Accordingly, polarized light in the specific vibration direction is supplied with high light usability.

Further, deterioration of the λ/4 phase plate 204 due to heat is reduced by providing the transparent plate 203 between the light emitting unit 201, which is a heat source, and the λ/4 phase plate 204. By reducing deterioration of the λ/4 phase plate 204 due to heat, the R-light source unit 101R performs normal polarization conversion for long time. Further, deterioration of the λ/4 phase plate 204 due to heat is further reduced by forming the transparent plate 203 of a transparent member that has a low thermal conductivity. If deterioration of the λ/4 phase plate 204 due to heat is reduced, it is particularly effective when the light emitting unit 201 that has a large output is used.

Since the influence of heat on the λ/4 phase plate 204 is reduced, the λ/4 phase plate 204 may be formed of an organic compound that has a relatively low heat resistance. The λ/4 phase plate 204 formed of the organic compound is relatively cheap. Therefore, by using the λ/4 phase plate 204 formed of the organic compound, the R-light source unit 101R is obtained at a low cost. Further, another advantage is that a change in the polarization conversion characteristic according to the wavelength characteristic of light become relatively small, by using the λ/4 phase plate 204 formed of the organic compound.

The G-light source unit 101G and the B-light source unit 101B have the same configuration as the R-light source unit 101R so as to supply the polarized light in the specific vibration direction with high light usability. Thus, the R-light source unit 101R, the G-light source unit 101G, and the B-light source unit 101B supply bright light efficiently. Accordingly, the projector 100 projects a bright image.

The reflector 202 in the embodiment is not limited to have a rectangular annular shape, and may have a circular annular shape. The reflector 202 may be appropriately formed according to each shape of the incident planes of the λ/4 phase plate 204 and the reflecting-type polarizing plate 205. The substrate 206 and the reflector 202 may be formed integrally. Further, the light source units 101R, 101G, and 101B may have a configuration such that a polarized light converting unit M that includes the λ/4 phase plate 204 and the reflecting-type polarizing plate 205 is detachably provided. When the light is modulated regardless of the vibration direction of the polarized light as with the case a tilt mirror device is used as the spatial light modulator, the λ/4 phase plate 204 and the reflecting-type polarizing plate 205 are not necessary. Thus, since the polarized light converting unit M is arranged optionally, the light source units 101R, 101G, and 101B are used broadly.

Figure 3:
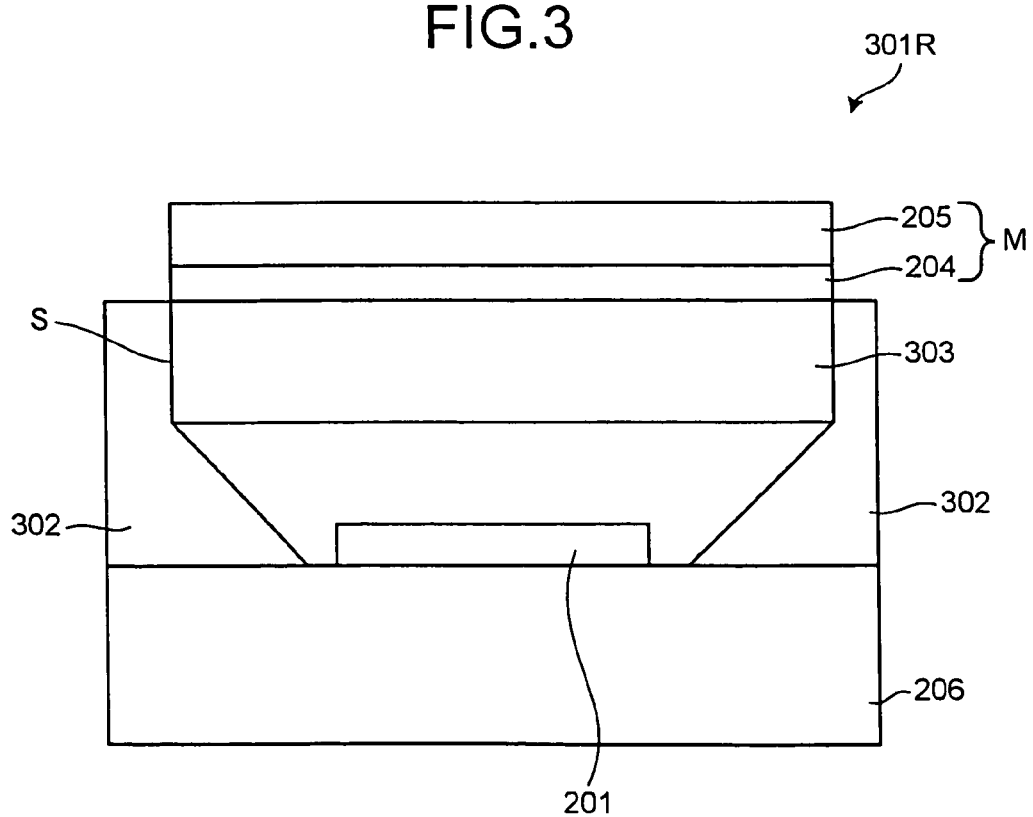
FIG. 3 is a cross-sectional view of a light source unit according to a second embodiment of the present invention.

FIG. 3 is a cross-sectional view of an R-light source unit 301R, which is a light source unit according to a second embodiment of the present invention. The light source unit in the second embodiment can be used for the projector 100 in the first embodiment. If elements are the same as those in the projector according to the first embodiment, the same reference signs are applied to the elements, and explanation for the elements is omitted. The light source unit according to the second embodiment includes a rod integrator 303 as a structure formed of an optically transparent member. The rod integrator 303 substantially uniformalizes the light amount distribution of the light from the light emitting unit 201.

The rod integrator 303 is provided between the light emitting unit 201 and the λ/4 phase plate 204, as with the transparent plate 203 in the first embodiment. There is a gap between an incident plane of the rod integrator 303 and the light emitting unit 201. The λ/4 phase plate 204 and the reflecting-type polarizing plate 205 are sequentially laminated on the emission plane of the rod integrator 303. A reflector 302 has a tapered surface on the light emitting unit 201 side as with the reflector 202 in the first embodiment. It is different from the reflector 202 in the first embodiment that the reflector 302 is extended up to the side S of the rod integrator 303.

The light enters into the rod integrator 303, and travels inside of the rod integrator, and the light repeats total reflection on the side S, which is an interface between a glass member and air. Consequently, the light amount distribution is substantially uniformalized. At this time, if the light enters into the side S of the rod integrator 303 at a smaller angle than the critical angle, the light is outputted from the side S of the rod integrator 303 without being totally reflected. Therefore, by providing the reflector 302 up to the side S of the rod integrator 303, the light outputted from the rod integrator 303 is reflected and returns in the direction of the rod integrator 303. Consequently, loss of light is reduced, and the light that travels at a large angle with respect to the optical axis is converted to the light that travels at a small angle with respect to the optical axis.

Since the rod integrator 303 is provided in the R-light source unit 301R, the light amount distribution of the light from the light emitting unit 201 is substantially uniformalized, as well as the polarization conversion. If the rod integrator 303 is provided as a structure formed of a transparent member, the rod integrator 303 can be arranged near the light emitting unit 201. When the rod integrator 303 is provided near the light emitting unit 201, lots of light that travels at a large angle with respect to the optical axis enters into the rod integrator 303 since the light is diffused by the light emitting unit 201. As the light has the larger angle with respect to the optical axis, more light is totally reflected by the rod integrator 303. Accordingly, when the rod integrator 303 is arranged as close to the light emitting unit 201 as possible, even if the length thereof in the optical axis direction is short, the rod integrator 303 substantially uniformalizes the light amount distribution of light sufficiently.

Also in the R-light source unit 301R in this embodiment, since the rod integrator 303 is provided near the light emitting unit 201, the short and small rod integrator 303 can be used. Accordingly, the light amount distribution of light from the light emitting unit 201 is substantially uniformalized with a small configuration. The respective shapes of the incident plane and the emission plane of the rod integrator 303 is determined appropriately according to each shape of the incident planes of the λ/4 phase plate 204 and the reflecting-type polarizing plate 205. When the amount of light outputted from the side S of the rod integrator 303 is small, the reflector 302 may be provided up to the position of the incident plane of the rod integrator 303 instead of being extended up to the side S of the rod integrator 303.

Figure 4:
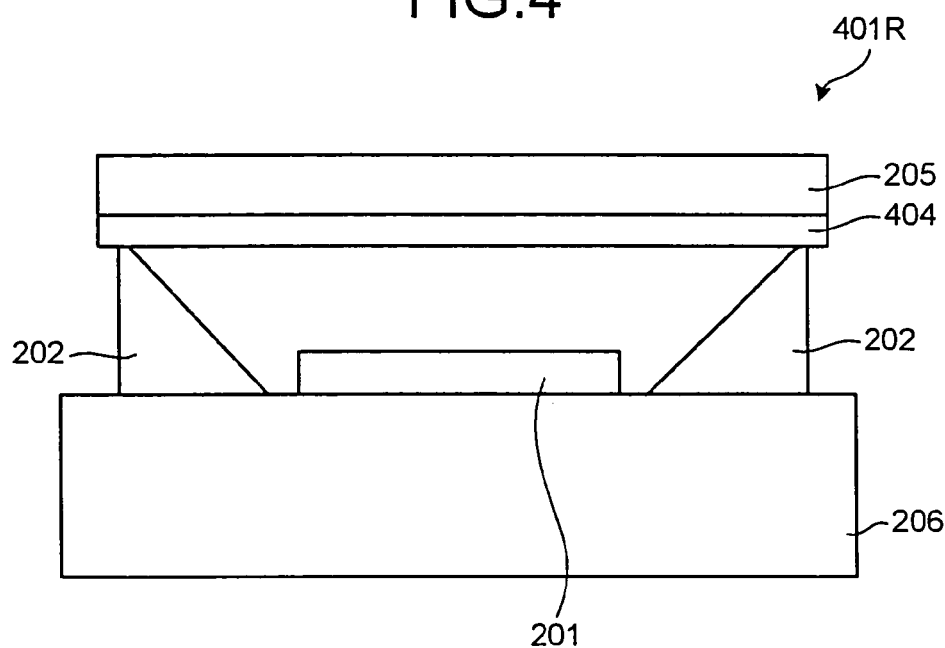
FIG. 4 is a cross-sectional view of a light source unit according to a third embodiment of the present invention.

FIG. 4 is a cross-sectional view of an R-light source unit 401R, which is a light source unit according to a third embodiment of the present invention. The light source unit in the third embodiment can be used in the projector 100 in the first embodiment. If elements are the same as those in the projector according to the first embodiment, the same reference signs are applied to the elements, and explanation for the elements is omitted. In the light source unit in the third embodiment, a λ/4 phase plate 404 is joined with the edge of the reflector 202.

The λ/4 phase plate 404 is provided on the emission side of the light emitting unit 201 and the reflector 202. The reflector 202 and the λ/4 phase plate 404 are joined with each other at a position closer to the emission side than the position where the light emitting unit 201 is provided. Therefore, there is a gap between the light emitting unit 201 and the λ/4 phase plate 404. The λ/4 phase plate 404 converts the polarized state of R light from the light emitting unit 201. A member formed of an inorganic compound, such as crystal and mica plate, can be used for the λ/4 phase plate 404.

The λ/4 phase plate 404 formed of such an inorganic member has relatively excellent heat resistance. Therefore, normal polarization conversion can be performed for long time even if a structure formed of a transparent member that has a low thermal conductivity is provided on the light emitting unit 201 side of the λ/4 phase plate 404. Accordingly, normal polarization conversion can be performed with a simple configuration. Also in the R-light source unit 401R in this embodiment, it is not necessary to join the reflector 202 with the λ/4 phase plate 404, so long as these are arranged close to each other.

Figure 5:
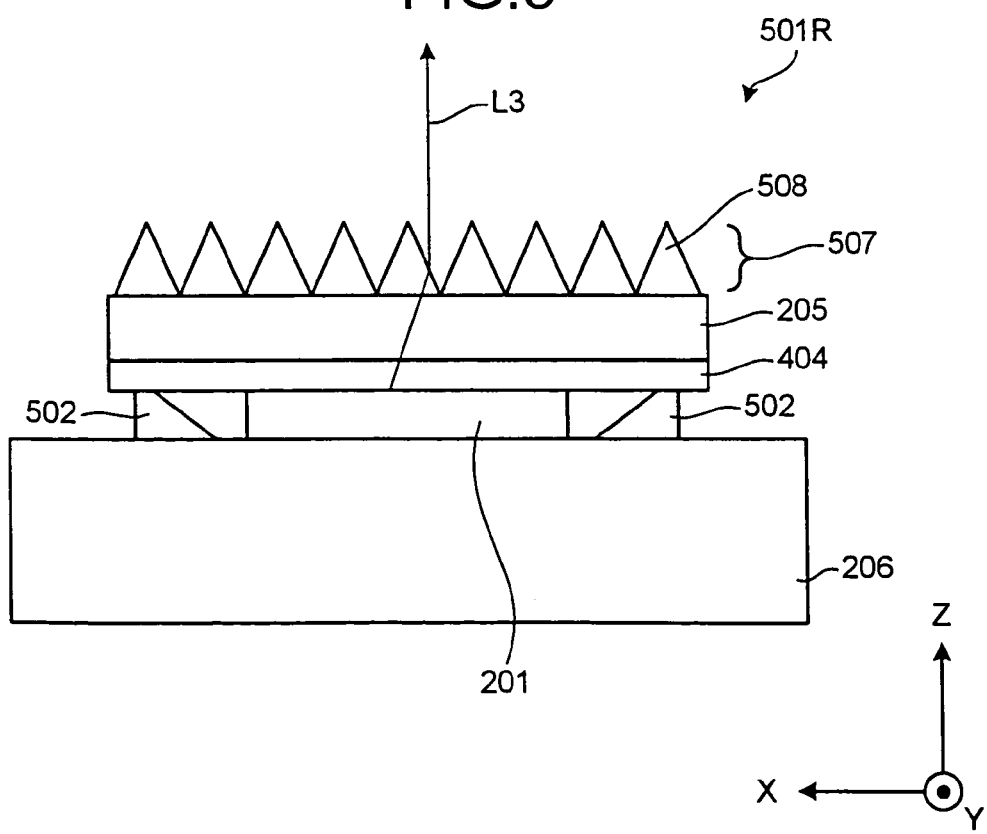
FIG. 5 is a cross-sectional view of a light source unit according to a fourth embodiment of the present invention.

FIG. 5 is a cross-sectional view of an R-light source unit 501R, which is a light source unit according to a fourth embodiment of the present invention. The light source unit in the fourth embodiment can be used in the projector 100 in the first embodiment. If elements are the same as those in the projector according to the first embodiment, the same reference signs are applied to the elements, and explanation for the elements is omitted. In the light source unit in the fourth embodiment, the λ/4 phase plate 404 is laminated on the emission-side surface of the light emitting unit 201.

The λ/4 phase plate 404 and the reflecting-type polarizing plate 205 are sequentially laminated on the emission-side surface of the light emitting unit 201. The λ/4 phase plate 404 is formed of a member of an inorganic compound, such as crystal and mica plate, as in the light source unit in the third embodiment. The λ/4 phase plate 404 that has excellent heat resistance can be laminated on the light emitting unit 201. The reflector 502 is provided, with the edge of the reflector 502 joined with the λ/4 phase plate 404, as in the light source unit in the third embodiment. The reflector 502 has a tapered surface on the light emitting unit 201 side, as in the light source unit in the first embodiment.

The gap is not provided between the light emitting unit 201 and the λ/4 phase plate 404, and the reflector 502 has the height that is substantially same as the thickness of the light emitting unit 201. The reflector 502 may be extended up to a position closer to the emission side than the position where the light emitting unit 201 is provided, as in the light source unit in the second embodiment. In the light source unit in this embodiment, since the reflector 502 has a tapered surface, diffusion of light that travels toward the side of the light emitting unit 201 is prevented, and the light is guided to the λ/4 phase plate 404.

A micro prism array 507, which is an optical element, is provided on a surface of the reflecting-type polarizing plate 205, and the surface is located on a side where the λ/4 phase plate 404 side is not arranged. The micro prism array 507 outputs the light that passes through the reflecting-type polarizing plate 205. The micro prism array 507 is formed of micro prisms 508 that have a protrusion on the emission side.

FIG. 6 is a perspective view as seen from the emission side of the micro prism array 507. The micro prism array 507 is provided by arranging the tiny micro prisms 508 in an array in a rectangular area. The micro prisms 508 have the longitudinal direction in the Y direction, which is one direction of the rectangular area. The micro prisms 508 are arranged in the X direction substantially orthogonal to the Y direction in the rectangular area. The shape of the micro prisms 508, in the XZ plane, is an isosceles triangle. The micro prisms 508 may be formed of a transparent member, such as a glass member or a resin member.

Referring back to FIG. 5, the behavior of light from the light emitting unit 201 will be explained. The light behaves in the same way as the light in the light source unit in the first embodiment until light L3 from the light emitting unit 201 is outputted from the reflecting-type polarizing plate 205. In the R-light source unit 501R in this embodiment, the light emitting unit 201, the λ/4 phase plate 404, and the reflecting-type polarizing plate 205 are laminated. In this configuration, the light from the light emitting unit 201 passes through the reflecting-type polarizing plate 205 without going through the air. For example, when the emission plane of the reflecting-type polarizing plate 205 is formed of a transparent member, such as cover glass, the light L3 may be totally reflected on the emission-side interface of the reflecting-type polarizing plate 205 after the light L3 reaches the emission plane of the reflecting-type polarizing plate 205. If the light is totally reflected by the reflecting-type polarizing plate 205, the amount of light emitted from the R-light source unit 501R decreases.

The micro prism array 507 outputs the light that passes through the reflecting-type polarizing plate 205. For example, when the micro prism array 507 is formed of a transparent member and a refractive index of the transparent member is substantially same as that of the cover glass of the reflecting-type polarizing plate 205, the light L3 travels to the emission plane of the reflecting-type polarizing plate 205, and travels toward the micro prism 508 in the same traveling direction without being totally reflected by the interface of the reflecting-type polarizing plate 205. Then, the light L3 reaches the inclined plane on which a protrusion of the micro prism 508 is formed. At this time, since the light L3 enters into the interfaces of the micro prisms 508 at an angle smaller than the critical angle, the light L3 is outputted from the micro prisms 508. The micro prism array 507 outputs the light that passes through the reflecting-type polarizing plate 205 in this manner.

Thus, by providing the micro prism array 507 for outputting the light that passes through the reflecting-type polarizing plate 205, emission of the light that passes through the reflecting-type polarizing plate 205 is accelerated, and the amount of light outputted from the R-light source unit 501R is decreased less. Accordingly, the light source unit has a configuration with high light usability. It is not necessary that the refractive index of the micro prisms 508 is substantially the same as that of the cover glass of the reflecting-type polarizing plate 205. The micro prisms 508 may have a refractive index larger than or smaller than that of the cover glass of the reflecting-type polarizing plate 205.

The optical element used in the light source unit in this embodiment may be a micro lens array 707 shown in FIG. 7 instead of the micro prism array 507 shown in FIG. 6. The micro lens array 707 is formed by arranging micro lenses 708 that have a spherical or aspherical curved surface in an array. The optical element may be formed by arranging fine structures that have a longitudinal direction in an array, or may be an optical element 807 shown in FIG. 8. The optical element 807 is formed by arranging micro prisms 808 that have a quadrangular pyramid shape in a matrix. The fine structures arranged in a matrix may be the micro prisms, shown in FIG. 8, that have the quadrangular pyramid shape, micro prisms that have a conic shape, a trigonal pyramid shape, or polyhedral shapes such as a pentagonal pyramid shape, or micro lenses that have a spherical or aspherical curved surface.

Figure 9:
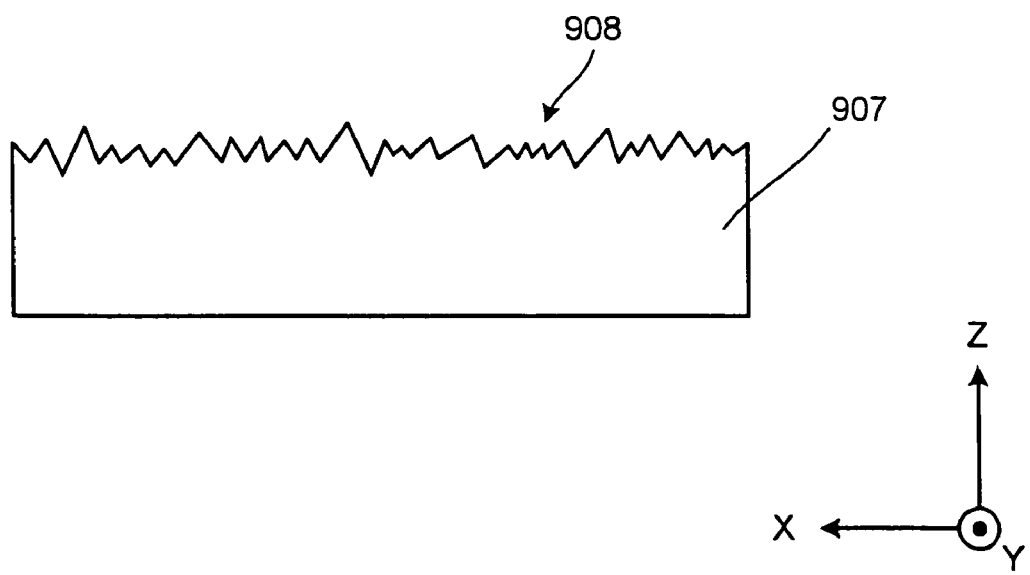
FIG. 9 is a cross-sectional view of still another optical element.

The optical element may be a single lens or prism, instead of fine micro lenses that is arranged or micro prisms that is arranged. Further, as shown in FIG. 9, the optical element may be an optical element 907 that has a rough surface 908 having random protrusions and recessions. The rough surface 908 of the optical element 907 can be formed, for example, by sand blasting for strongly blowing particulates, or by irradiating oxygen plasma or argon plasma. In the light source unit in the above embodiments, the λ/4 phase plate may be laminated on the light emitting unit 201. In this case, by providing the optical element on the emission-side surface of the reflecting-type polarizing plate 205 as in this embodiment, the light that passes through the reflecting-type polarizing plate 205 is efficiently outputted.

Figure 10:
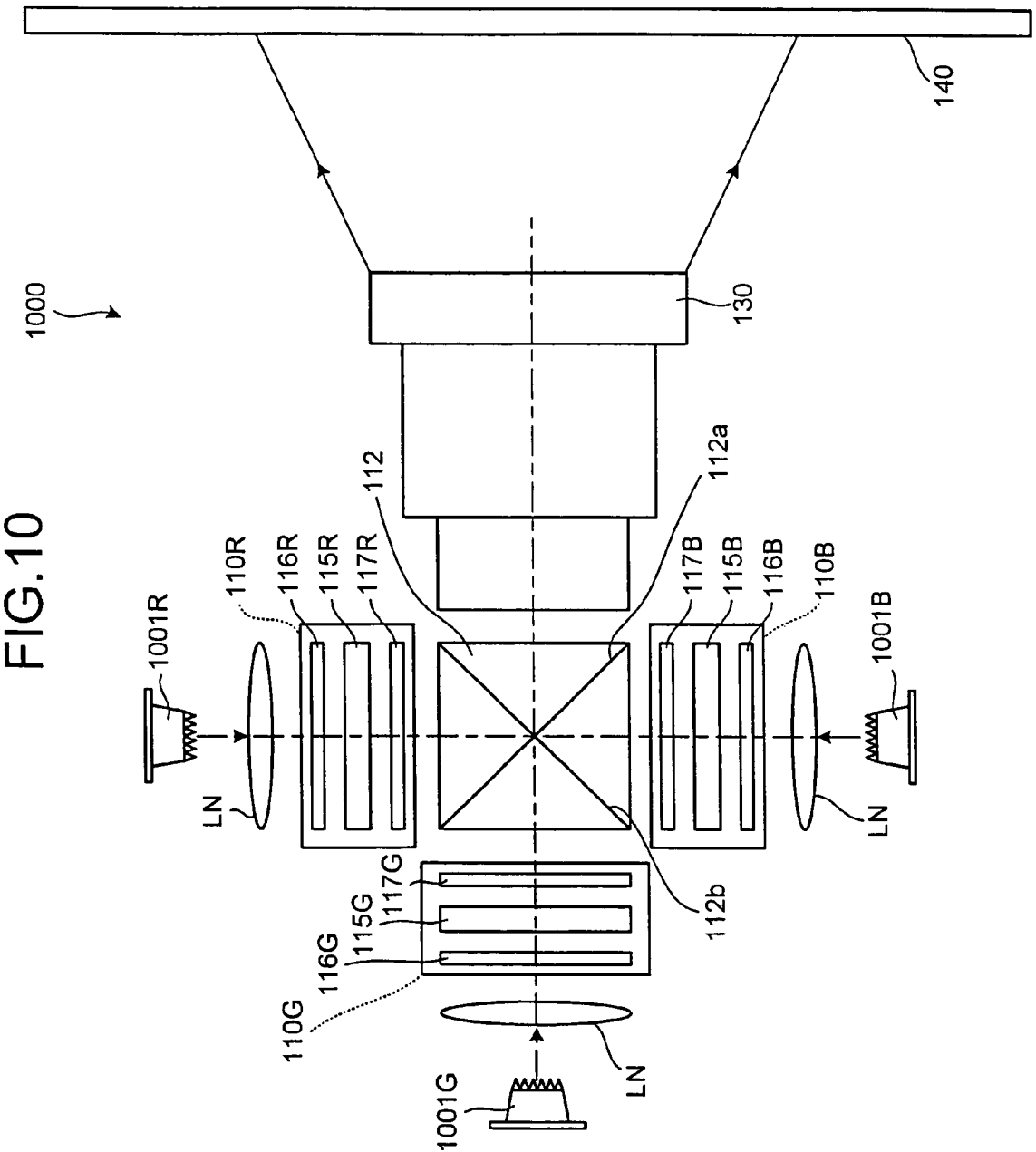
FIG. 10 is a schematic block diagram of a projector according to a fifth embodiment of the present invention.

FIG. 10 is a schematic block diagram of a projector 1000 according to a fifth embodiment of the present invention. If elements are the same as those in the projector according to the first embodiment, the same reference signs are applied to the elements, and explanation for the elements is omitted. The projector 1000 has an R-light source unit 1001R that supplies R light, which is a first color light, a G-light source unit 1001G that supplies G light, which is a second color light, and a B-light source unit 1001B that supplies B light, which is a third color light.

The R-light source unit 1001R supplies polarized light in a specific vibration direction, for example, p-polarized R-light. The R light comes from the R-light source unit 1001R, passes through a lens LN, and then enters into an R-light spatial light modulator 110R. The G-light source unit 1001G supplies polarized light in a specific vibration direction, for example, s-polarized G-light. The G light comes from the G-light source unit 1001G, passes through a lens LN, and then enters into a G-light spatial light modulator 110G. The B-light source unit 1001B supplies polarized light in a specific vibration direction, for example, p-polarized B-light. The B light comes from the B-light source unit 1001B, passes through a lens LN, and then enters into a B-light spatial light modulator 110B.

Figure 11:
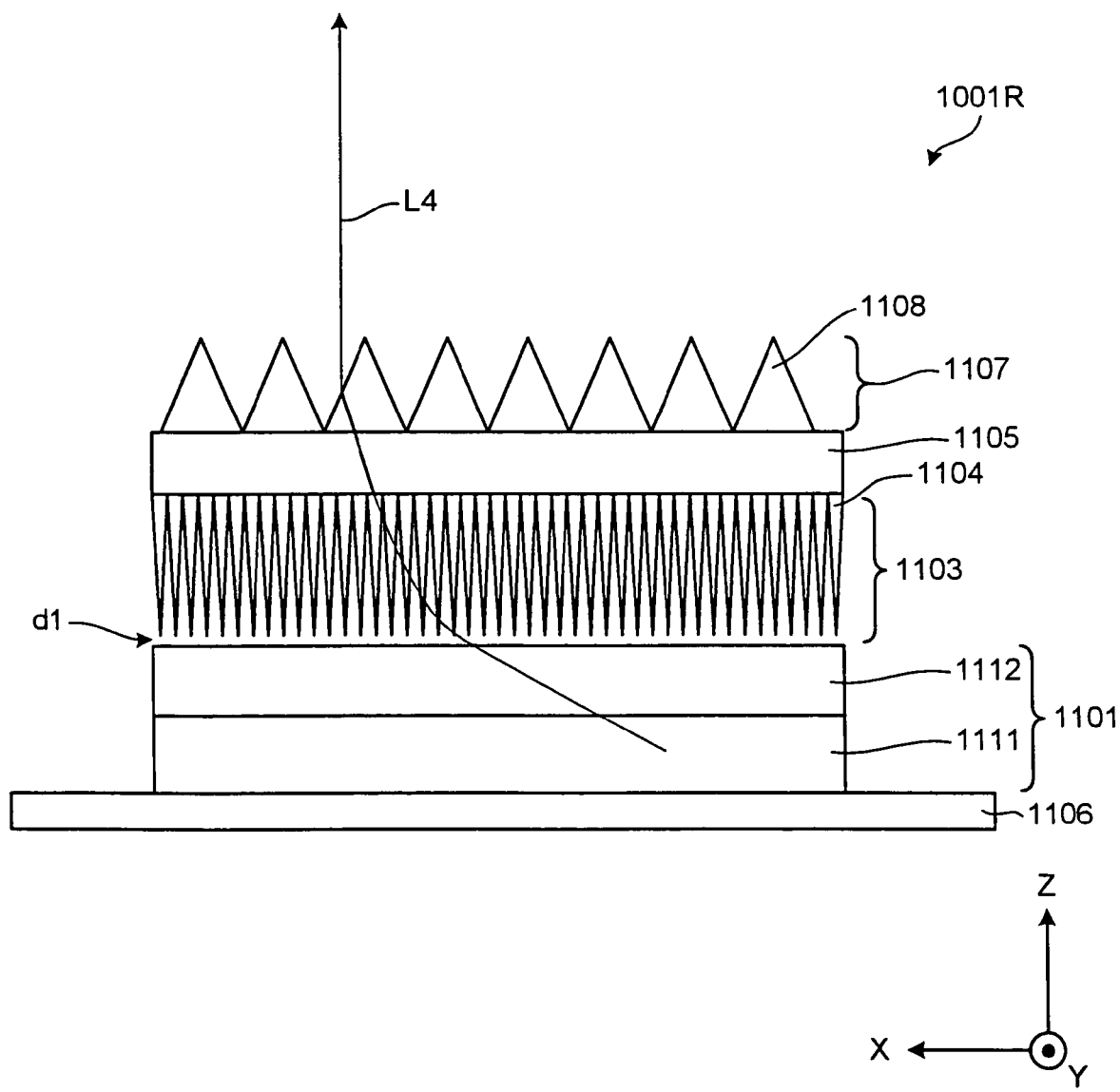
FIG. 11 is a cross-sectional view of a light source unit according to the fifth embodiment.

FIG. 11 is a cross-sectional view of the R-light source unit 1001R. In the R-light source unit 1001R, a light emitting unit 1101 is mounted on a mounting board 1106. The light emitting unit 1101 is a light-emitting chip of an LED, which is a solid light emitting diode. The light emitting unit 1101 supplies the R light.

The light emitting unit 1101 includes a semiconductor layer 1111 provided on the mounting board 1106, and a sapphire substrate 1112 provided on the semiconductor layer 1111. The light emitting unit 1101 has a flip-chip structure. In the flip-chip structure, the semiconductor layer 1111 is provided below the sapphire substrate 1112. The semiconductor layer 1111 has a p-type semiconductor layer and an n-type semiconductor layer (not shown). The p-type semiconductor layer and the n-type semiconductor layer may be formed of, for example, gallium nitride. The p-type semiconductor layer and the n-type semiconductor layer are respectively connected to a p-type electrode and an n-type electrode. The light emitting unit 1101 that has the flip-chip structure includes the p-type electrode and the n-type electrode on the mounting board 1106 side. For example, the p-type electrode is formed of a highly reflective metal member. The light emitting unit 1101 supplies light generated by the semiconductor layer 1111 directly, or supplies light generated by the semiconductor layer 1111 via the sapphire substrate 1112 after the light is reflected by the p-type electrode on the mounting board 1106 side.

A fine structure 1103 is provided on the emission side of the sapphire substrate 1112. The fine structure 1103 includes a plurality of fine protrusions 1104. The fine protrusions 1104 are provided on the incident plane of a glass substrate 1105, and the incident plane is located on the light emitting unit 1101 side. The fine structure 1103, the glass substrate 1105, and a micro prism array 1107 form a light propagating unit, and the light propagating unit propagates evanescent light from the sapphire substrate 1112 in the light emitting unit 1101. The fine protrusions 1104, the glass substrate 1105, and the micro prism array 1107 are formed of glass, which is a transparent member.

The fine protrusions 1104 have a thin conic shape and protrude toward the sapphire substrate 1112. The fine protrusions 1104 may be a mesoporous structure, which is used for forming a photonic crystal, or may be a crystal that is self-grown by using a silicon aero gel. In order to form the fine protrusions 1104, a fine protrusion pattern may be formed by a photolithographic process.

There is a gap d1 between the fine protrusions 1104 and the sapphire substrate 1112. Since there is the gap d1 between the sapphire substrate 1112 and the fine protrusions 1104, the evanescent light from the sapphire substrate 1112 reaches the fine protrusions 1104. In the R-light source unit 1001R, a length of the gap d1 is, for example, from one tenth to half the wavelength of the R light. In the fine structure 1103, the gaps d1 corresponding to the respective fine protrusions 1104 may have the different length. The length needs to enable propagating the evanescent light on the surface of the sapphire substrate 1112 to the fine protrusions 1104, and for example, the gap d1 needs only to have a length of from one tenth to half the wavelength of the R light. The glass substrate 1105 has a micro prism array 1107 on the emission plane on a side opposing to a side where the light emitting unit 1101 is arranged. The micro prism array 1107 is an optical element that outputs the light transmitted through the fine structure 1103 and the glass substrate 1105.

The micro prism array 1107 is provided in such a manner that fine micro prisms 1108 are arranged in an array in a rectangular area on the glass substrate 1105. The micro prism array 1107 has the same configuration as that of the micro prism array 507 in the fourth embodiment shown in FIG. 6. The micro prisms 1108 are formed, for example, to have a height 10 times as long as the wavelength of the R light.

The light is generated in the semiconductor layer 1111 in the light emitting unit 1101 and emitted from the light emitting unit 1101 via the sapphire substrate 1112. For example, light is generated in the light emitting unit 1101 in the optical axis direction Z and is emitted directly from the light emitting unit 1101. Light L4 that is generated in the semiconductor layer 1111 and enters into the emission-side interface of the sapphire substrate 1112 at an angle equal to or larger than the critical angle will be explained.

When the light L4 enters into the emission side of the sapphire substrate 1112 at an angle equal to or larger than the critical angle, evanescent light leaks from the emission side of the sapphire substrate 1112 to the outside of the sapphire substrate 1112. The evanescent light is generated on the emission side of the sapphire substrate 1112 and in a thickness equal to or smaller than the wavelength of the R light from the emission side of the sapphire substrate 1112. The fine protrusions 1104 in the fine structure 1103 are provided at a position where the evanescent light from the sapphire substrate 1112 reaches. Therefore, the evanescent light is generated on the emission side of the sapphire substrate 1112 and reaches the fine structure 1103.

The fine structure 1103 includes a plurality of fine protrusions 1104 that protrude from the glass substrate 1105 side toward the sapphire substrate 1112. The fine protrusions 1104 usually thicken from the sapphire substrate 1112 toward the glass substrate 1105. Therefore, the evanescent light reaches the fine structure 1103 and behaves as if the refractive index increases when the light travels through the fine structure 1103 and comes closer to the glass substrate 1105. When the evanescent light behaves as if the refractive index increases in the fine structure 1103, the evanescent light changes the direction gradually toward the emission side and goes toward the glass substrate 1105. By the fine protrusions 1104, the evanescent light is propagated to the emission side. By propagating the evanescent light to the emission side, the evanescent light goes toward the glass substrate 1105 without returning into the sapphire substrate 1112 again.

Preferably, the glass member that forms the fine protrusions 1104 has a refractive index larger than that of a sapphire member that forms the sapphire substrate 1112. When the refractive index is large, the fine structure 1103 converts the R light that travels at an angle larger than the critical angle of the sapphire substrate 1112 to the R light that travels at an angle closer to the optical direction. The refractive index of the glass member that forms the fine protrusions 1104 may be about the same as that of the sapphire member that forms the sapphire substrate 1112.

The light is transmitted through the fine structure 1103 directly, passes through the glass substrate 1105, and enters into the micro prism array 1107. The light L4 then reaches an inclined plane that forms the protrusion of the micro prism 1108. At this time, the light L4 enters into the interface of the micro prism 1108 at an angle smaller than the critical angle, and is outputted from the micro prism 1108. Thus, the light L4 is transmitted through the fine structure 1103, the glass substrate 1105, and the micro prism array 1107, and outputted from the micro prism array 1107. Thus, the R-light source unit 1001R takes out the light L4 from the light emitting unit 1101 to the outside. When the refractive indexes of the glass substrate 1105 and the micro prism array 1107 are substantially the same as that of the fine structure 1103, the glass substrate 1105 and the micro prism array 1107 allows the light to travel as it is, without refracting the light from the fine structure 1103. The glass substrate 1105 and the micro prism array 1107 may be formed of a member that has a different refractive index from that of the fine structure 1103.

In case only the light emitting unit 1101 is arranged, the light L4 enters into the emission plane of the sapphire substrate 1112 at an angle larger than the critical angle, is totally reflected on the emission side interface of the sapphire substrate 1112, and then taken into the sapphire substrate 1112. The light taken into the light emitting unit 1101 is partially absorbed while repeating total reflection and reflection on the electrode layer. Since the light is taken into the light emitting unit 1101 partially, the amount of outputted light decreases in the R-light source unit 1001R. On the other hand, in the R-light source unit 1001R according to the present invention, since the fine structure 1103 is provided, the evanescent light outside of the sapphire substrate 1112 is taken out.

Since the sapphire substrate 1112 is very hard and it is not easy to perform chemical processing such as oxidation, profiling of the sapphire substrate 1112 is difficult. On the other hand, in the present invention, it is not necessary to perform processing of the sapphire substrate 1112, and the light taken into the light emitting unit 1101 is easily reduced. When another transparent member is bonded to the sapphire substrate 1112, if the sapphire substrate 1112 and another member thermally expand independently due to the heat from the light emitting unit 1101, a distortion occurs in the bonded portion. The light emitting unit 1101 may be damaged due to the distortion. Particularly, since the output of the LED is getting larger these days, it can be considered that deterioration in such a bonded portion becomes notable.

Since the fine structure 1103 needs only to be provided near the sapphire substrate 1112 and at a position where the evanescent light reaches, it is not necessary to bond the fine structure 1103 and the sapphire substrate 1112. Therefore, a distortion between the fine structure 1103 and the sapphire substrate 1112 is reduced, and the configuration becomes hardly damaged. Particularly, in a high-output LED, deterioration in the light emitting unit 1101 is reduced.

Moreover, since the thickness of the sapphire substrate is very thin, for example, if an optical element is directly provided on the sapphire substrate, a large load may be applied on the light emitting unit 1101 while forming of optical element. In the present invention, the micro prism array 1107 may be provided on the glass substrate 1105 other than the sapphire substrate 1112. Hence, the load applied on the light emitting unit 1101 is reduced, and production of the R-light source unit 1001R is facilitated. Accordingly, the light taken into the light emitting unit 1101 is reduced, and bright light is supplied efficiently.

Furthermore, by providing the fine structure 1103 to take out the evanescent light toward the emission side, the light is outputted efficiently. By providing the micro prism array 1107, total reflection of the light that is transmitted through the fine structure 1103 and the glass substrate 1105 is reduced, the emission of the light to the outside is facilitated, and the light is outputted from the R-light source unit 1001R more efficiently. The G-light source unit 1001G and the B-light source unit 1001B have the same configuration as the R-light source unit 1001R so that the amount of light taken into the light emitting unit 1101 is decreased and bright light is supplied. Accordingly, the R-light source unit 1001R, the G-light source unit 1001G, and the B-light source unit 1001B supplies bright light efficiently. As a result, the projector 1000 projects a bright image.

The shape of the fine protrusion 1104 needs only to be capable of propagating the evanescent light on the surface of the sapphire substrate 1112, and is not limited to the thin conic shape. For example, the fine protrusion 1104 may have a form similar to a trapezoid, such that the edge of the protrusion is chipped off. The fine structure 1103 may have both fine protrusions 1104, which have a conic shape, and fine protrusions 1104, which have a shape similar to a trapezoid. Further, in the fine protrusion 1104, it is not necessary that the respective vertical widths of all fine protrusions 1104 are same with respect to the protruding direction, and for example, some fine protrusions 1104 may have the larger width than the other fine protrusions 1104. In this case, if the light is propagated through the fine protrusions 1104 that have the larger width, the light is taken out toward the emission side.

Figure 8:
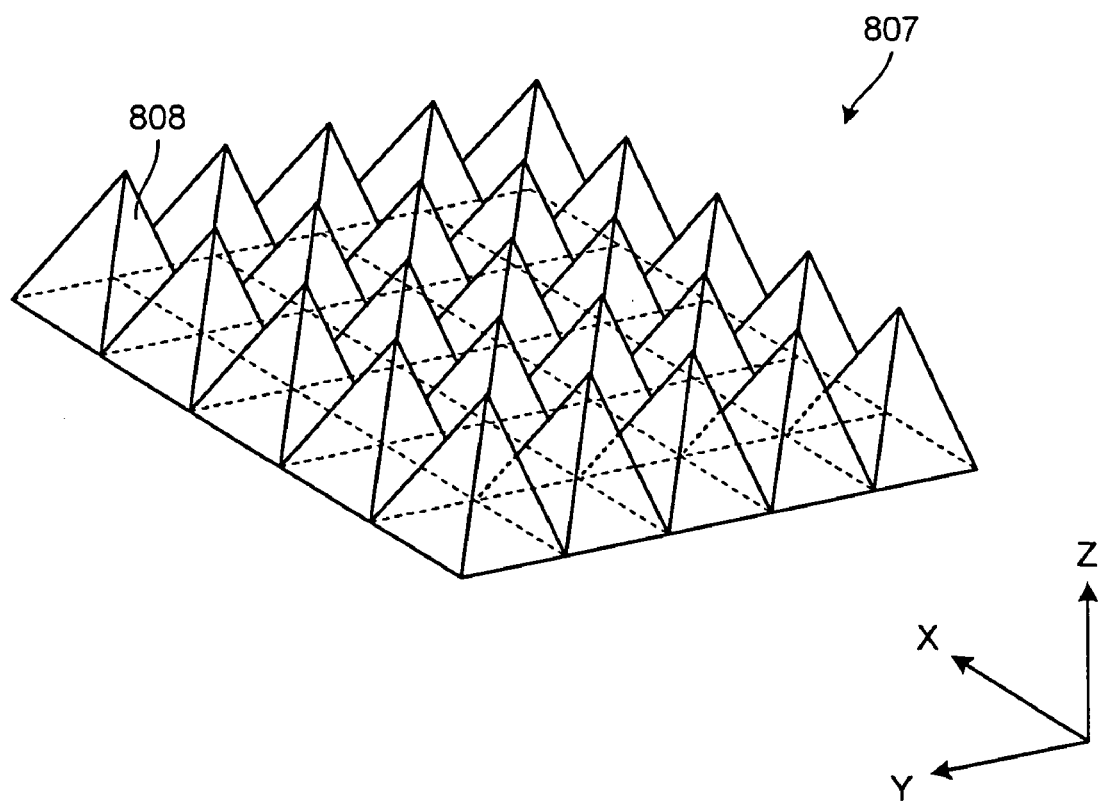
FIG. 8 is a perspective view of still another optical element.

The optical element used in the light source unit in this embodiment may be the micro prism array 1107, or an optical element similar to those shown in FIGS. 7 to 9, as with the fourth embodiment.

Figure 12:
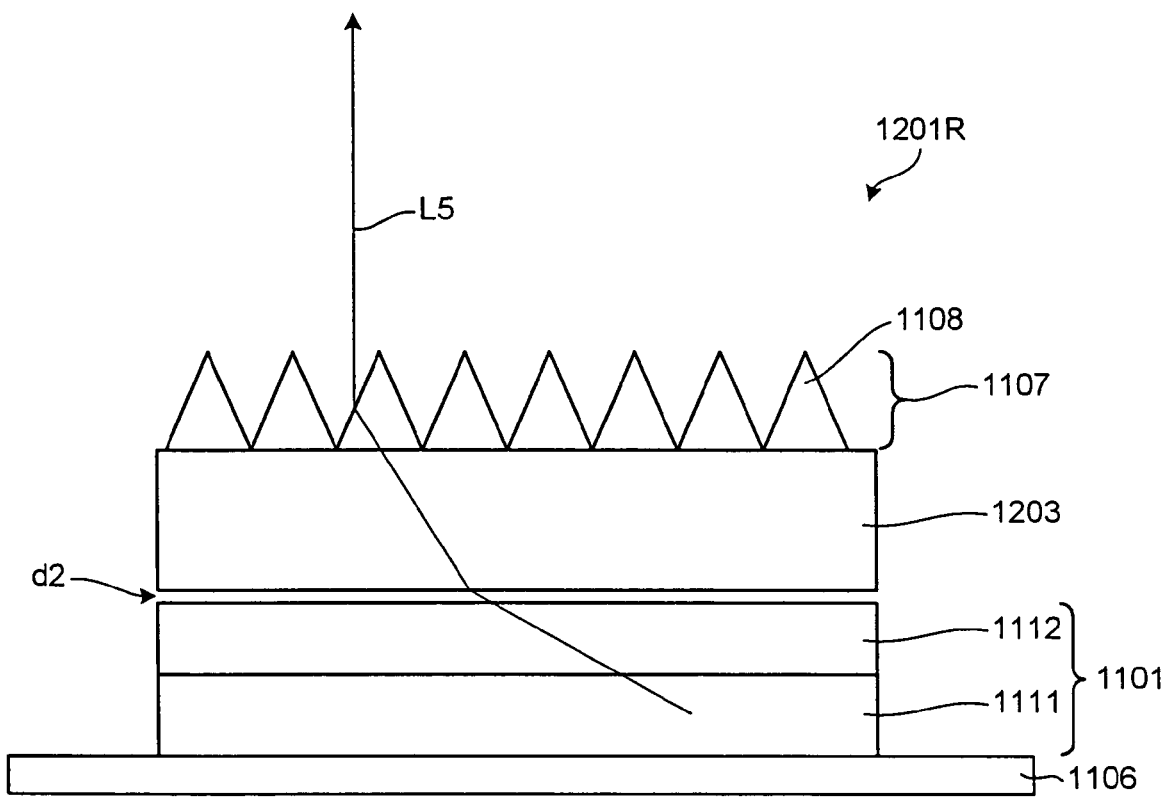
FIG. 12 is a schematic block diagram of a projector according to a sixth embodiment of the present invention.

FIG. 12 is a cross-sectional view of an R-light source unit 1201R according to a sixth embodiment of the present invention. The light source unit in this embodiment can be used in the projector 1000 according to the fifth embodiment. If elements are the same as those in the projector 1000 according to the fifth embodiment, the same reference signs are applied to the elements, and explanation for the elements is omitted. The light source unit in this embodiment has a glass substrate 1203, and the glass substrate has a flat plane on the sapphire substrate 1112 side. In the R-light source unit 1201R, the glass substrate 1203 and the micro prism array 1107 form a light propagating unit that propagates the evanescent light from the sapphire substrate 1112 in the light emitting unit 1101.

A gap d2 is arranged between the sapphire substrate 1112 and the glass substrate 1203, and he evanescent light from the sapphire substrate 1112 thereby reaches the glass substrate 1203. In the R-light source unit 1201R, for example, the length of the gap d2 is one tenth the wavelength of the R light. Preferably, the flat plane of the glass substrate 1203 on the sapphire substrate 1112 side is a plane with protrusions and recessions that have a length of from one tenth to half the wavelength of the R light. By using the glass substrate 1203 that has the flat surface with the protrusions and recessions having a length of from one tenth to half the wavelength of the R light, the evanescent light is taken out to the emission side. Accordingly, the light taken into the light emitting unit 1101 is reduced, and bright light is supplied efficiently, as in the light source unit in the fifth embodiment.

Preferably, the refractive index of the glass substrate 1203 is larger than that of the sapphire member that forms the sapphire substrate 1112. By increasing the refractive index, the glass substrate 1203 converts the R light that travels at an angle larger than the critical angle of the sapphire substrate 1112 to the light that travels at an angle closer to the optical direction. The refractive index of the glass member that forms the glass substrate 1203 may be about the same as that of the sapphire member that forms the sapphire substrate 1112.

Figure 13:
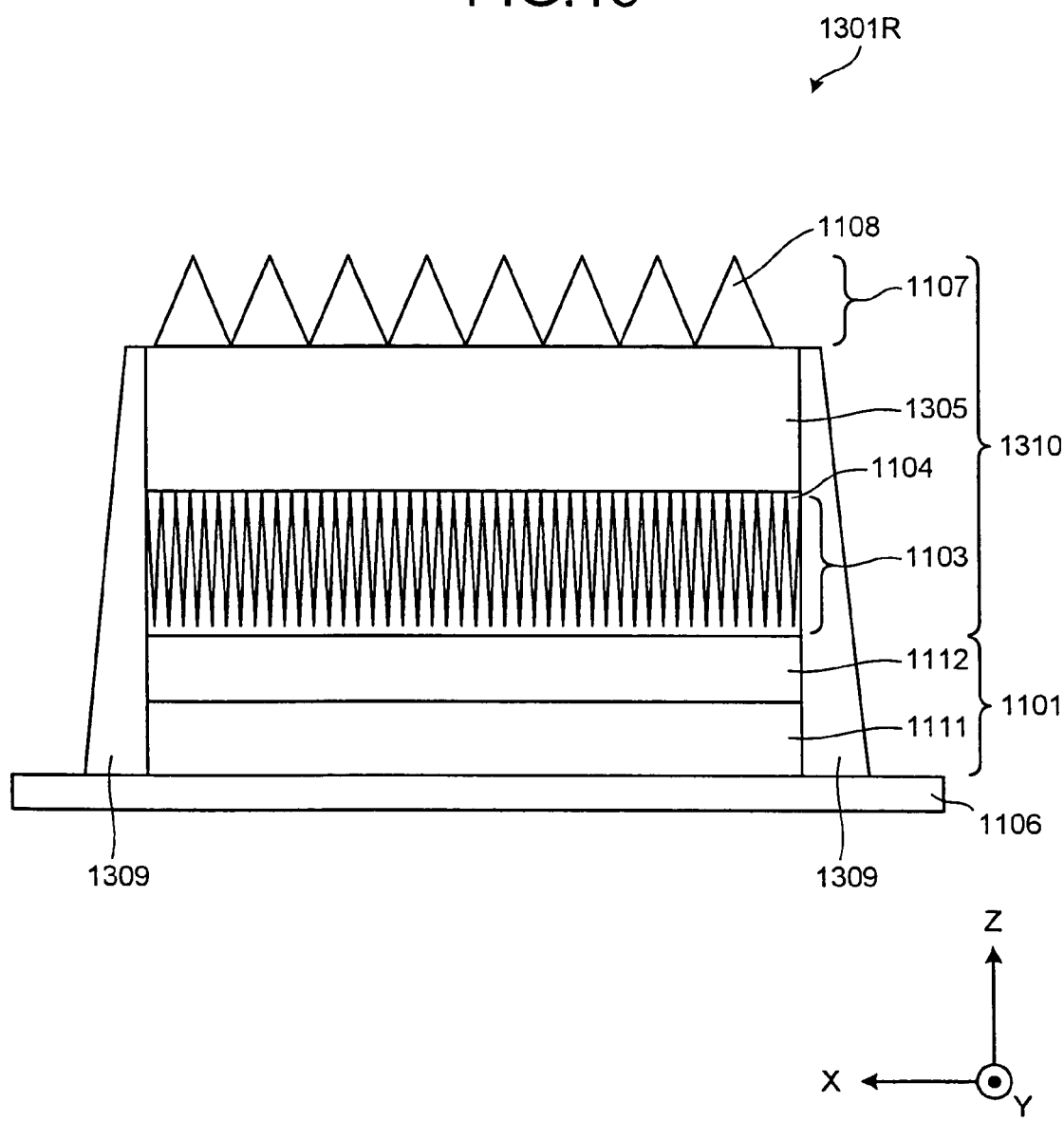
FIG. 13 is a schematic block diagram of a projector according to a seventh embodiment of the present invention.

FIG. 13 is a cross-sectional view of an R-light source unit 1301R according to a seventh embodiment of the present invention. The light source unit in this embodiment can be used in the projector 1000 according to the fifth embodiment. If elements are the same as those in the projector 1000 according to the fifth embodiment, the same reference signs are applied to the elements, and explanation for the elements is omitted. The light source unit in this embodiment has a rod integrator 1310, which is a light propagating unit. The rod integrator 1310 substantially uniformalizes the light amount distribution of the light from the light emitting unit 1101.

The rod integrator 1310 has a light guiding unit 1305 formed of a columnar glass member. The fine structure 1103 includes a plurality of fine protrusions 1104 and the fine structure 1103 is provided on the light-emitting-unit 1101 side incident-plane of the light guiding unit 1305. Further, the micro prism array 1107, which is an optical element that outputs the light propagated through the rod integrator 1310, is provided on the emission side of the light guiding unit 1305, and the emission side is a side opposite to a side where the light emitting unit 1101 is arranged. The rod integrator 1310 substantially uniformalizes the light amount distribution by repeating total reflection of light from the light emitting unit 1101 on the interface of the light guiding unit 1305. Accordingly, the light source unit has high light usability and uniformalizes the light amount distribution of light from the light emitting unit 1101.

The micro prism array 1107 may be directly formed on the emission side of the light guiding unit 1305, or may be adhered on the emission-side surface of the light guiding unit 1305. A reflector 1309 is provided on the mounting board 1106, near the light emitting unit 1101 and the rod integrator 1310. In FIG. 13, the reflector 1309 corresponds to two trapezoids on the right and left side of the light emitting unit 1101 and the rod integrator 1310. The reflector 1309 is provided so as to surround the light emitting unit 1101 and the rod integrator 1310.

By providing the reflector 1309 around the rod integrator 1310, after the light enters into the interface of the light guiding unit 1305 at an angle equal to or smaller than the critical angle and is outputted from the light guiding unit 1305, the light is reflected by the reflector 1309 and returns to the light guiding unit 1305. Accordingly, by providing the reflector 1309, loss of light is reduced. Further, by providing the reflector 1309 on the side of the rod integrator 1310, the light that travels at a large angle with respect to the optical axis is converted to the light that travels at a small angle with respect to the optical axis.

Although the LED chip is used for the light emitting unit in the light source unit in the above embodiments, other solid light emitting units such as an EL device and a semiconductor laser may be used for the light emitting unit. Further, although the liquid-crystal-type spatial-light-modulator is used as the spatial light modulator for the projectors in the above embodiments, not only the transmission-type liquid-crystal-display unit but also a reflecting-type liquid-crystal-display unit may be used. The projector may be configured so as to have a single liquid-crystal-type spatial-light-modulator instead of three liquid-crystal-type spatial-light-modulators.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A light source unit comprising:
a light emitting unit that includes
a substrate having an incident side and an emission side opposed to each other; and
a light propagating unit that propagates light from the light emitting unit,
the light propagating unit being formed of a transparent member, and being arranged to propagate evanescent light from the substrate in the light emitting unit, and
the light propagating unit including a transparent substrate having an incident plane on a side of the light emitting unit, the incident plane having a fine structure including thin protrusions for propagating evanescent light, wherein
a semiconductor layer is provided on the incident side of the substrate for supplying light via the substrate to the light propagating unit,
a micro prism array is provided on an emission side of the transparent substrate, and a gap is provided between the thin protrusions and the emission side of the substrate, and a length of the gap is equal to or smaller than a wavelength of the emitted light.

2. The light source unit according to claim 1, wherein the light propagating unit has an emission plane on a side where the light from the light emitting unit is outputted, and the micro prism array is configured to output the light transmitted through the light propagating unit.

3. The light source unit according to claim 1, wherein
the light propagating unit is a rod integrator that substantially uniformalizes light amount distribution of the light from the light emitting unit, and
the light propagating unit has an incident plane on a side where the light from the light emitting unit enters, an emission plane on a side where the light from the light emitting unit is outputted, and is arranged to the light propagated through the light propagating unit.

4. A projector comprising:
a light source unit that includes
   a light emitting unit that includes a substrate having an incident side and an emission side opposed to each other; and
   a light propagating unit that propagates light from the light emitting unit, the light propagating unit being formed of a transparent member, and being arranged to a propagate evanescent light from the substrate in the light emitting unit, and the light propagating unit including a transparent substrate having an incident plane on a side of the light emitting unit, the incident plane having a fine structure including thin protrusions for propagating evanescent light, wherein
   a semiconductor layer is provided on the incident side of the substrate for supplying light via the substrate to the light propagating unit,
   a micro prism array is provided on an emission side of the transparent substrate, and
   a gap is provided between the thin protrusions and the emission side of the substrate, and a length of the gap is equal to or smaller than a wavelength of the emitted light;
a spatial light modulator that modulates the light from the light source unit according to an image signal; and
a projection lens that projects the light modulated by the spatial light modulator.

* * * * *